(12) United States Patent
Scott et al.

(10) Patent No.: US 8,432,185 B2
(45) Date of Patent: Apr. 30, 2013

(54) RECEIVER CIRCUITS FOR DIFFERENTIAL AND SINGLE-ENDED SIGNALS

(75) Inventors: Gregory S. Scott, Santa Clara, CA (US); Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/115,824

(22) Filed: May 25, 2011

(65) Prior Publication Data

US 2012/0299653 A1    Nov. 29, 2012

(51) Int. Cl.
*H03K 17/16*    (2006.01)
*H03K 19/003*    (2006.01)

(52) U.S. Cl.
USPC .............................................. 326/30; 326/83

(58) Field of Classification Search ........................ None
See application file for complete search history.

(56) References Cited

U.S. PATENT DOCUMENTS

| | | | |
|---|---|---|---|
| 5,243,623 A | 9/1993 | Murdock | |
| 5,736,871 A | 4/1998 | Goto | |
| 5,910,730 A * | 6/1999 | Sigal | 326/24 |
| 6,046,621 A | 4/2000 | Crowley | |
| 6,317,369 B1 | 11/2001 | Kubo | |
| 6,433,627 B1 | 8/2002 | Ruesch | |
| 6,917,562 B2 | 7/2005 | Schaefer | |
| 7,023,238 B1 | 4/2006 | Camarota | |
| 7,030,665 B2 | 4/2006 | Takeuchi | |
| 7,091,741 B2 | 8/2006 | Kim | |
| 7,127,003 B2 | 10/2006 | Rajan et al. | |
| 7,288,980 B2 | 10/2007 | Lundberg | |
| 7,514,968 B1 | 4/2009 | Lai et al. | |
| 7,639,167 B2 | 12/2009 | Tsuchi | |
| 7,889,579 B2 | 2/2011 | Faue | |
| 7,961,007 B2 * | 6/2011 | Scott et al. | 326/86 |
| 2005/0046472 A1 | 3/2005 | Kim | |
| 2005/0162292 A1 * | 7/2005 | Kanekawa et al. | 341/111 |
| 2007/0079147 A1 | 4/2007 | Pyeon et al. | |
| 2008/0189457 A1 | 8/2008 | Dreps | |
| 2008/0279310 A1 | 11/2008 | Wu | |
| 2010/0279645 A1 | 11/2010 | Scott et al. | |

OTHER PUBLICATIONS

U.S. Appl. No. 13/100,630, filed May 4, 2011, Apple Inc, Gregory S. Scott, et al., all pages.
U.S. Appl. No. 13/162,360 entitled "Receiver Circuits for Differential and Single-Ended Signals;" filed Jun. 16, 2011.

* cited by examiner

*Primary Examiner* — Crystal L Hammond
(74) *Attorney, Agent, or Firm* — Lawrence J. Merkel; Meyertons, Hood, Kivlin, Kowert & Goetzel, P.C.

(57) ABSTRACT

Receiver circuits for differential and single-ended signals are disclosed. A receiver may include a differential amplifier configured to receive a first signal of a differential pair at a first input and a second signal of the differential pair at a second input when operating in differential mode, and a single-ended signal at the first input and a reference signal at a third input when operating in single-ended mode. The receiver may also include an inverter coupled to the differential amplifier. The inverter may be configured to provide a first beta ratio in differential mode and a second beta ratio in single-ended mode. Several receivers may be used, for example, to process a differential clock signal and one or more single-ended data signals referenced to the clock signal and/or differential data signals referenced to a single-ended clock signal. The rise/fall delays of each signal through each respective receiver may be independently adjusted.

25 Claims, 5 Drawing Sheets

RECEIVER CIRCUITS FOR DIFFERENTIAL AND SINGLE-ENDED SIGNALS

BACKGROUND

1. Field of the Invention

This invention is related to the field of integrated circuits and, more particularly, to receiver circuits.

2. Description of the Related Art

Integrated circuits (ICs) generally include a core circuit that implements the various operations that the IC is designed to perform, a driver circuit that drives output signals from the core circuit to an external circuit, and a receiver circuit that receives input signals from the external circuit and provides the received signals to the core circuit. The driver and receiver circuitry buffer and isolate the core circuit from the external circuit, thus handling the larger loads, higher current flows, higher voltages, noise, etc. that are typically involved in external communications.

Some ICs are configured to receive "singled-ended" signals—that is, signals that are generated relative to a fixed reference voltage and transmitted over a single wire. Other ICs are configured to receive "differential" signals—that is, two complementary signals transmitted over two separate wires. Differential signaling is particularly well suited for use in high speed IC interfaces due to its improved power characteristics and noise immunity. In certain situations, however, it may be desirable for an IC to handle both single-ended and differential signals. For example, the mobile double data rate 2(mDDR2) memory interface (sometimes referred to as "low power DDR2" or "LPDDR2" interface) permits single-ended data signaling with a differential clock

SUMMARY

Receiver circuits for differential and single-ended signals are disclosed. In an embodiment, a receiver circuit may operate in differential or single-ended mode. For example, a receiver circuit may include a differential amplifier that is configured to receive a first signal of a differential pair of signals at a first input and a second signal of the differential pair of signals at a second input when operating in differential mode. The differential amplifier may also be configured to receive a single-ended signal at the first input and a reference signal at a third input when operating in single-ended mode.

The receiver circuit may also include an inverter coupled to the differential amplifier. The inverter may be configured to provide a first beta ratio in differential mode and a different, second beta ratio in the single-ended mode. For example, the inverter may include one or more additional p-type and/or n-type transistors that are switched on or off when in a particular mode of operation under control of one or more enabling signals. In an embodiment, the same enabling signal(s) that control a given receiver circuit's mode of operation also set an inverter's beta ratio, and thus control the rise/fall delay of the signal propagating through the receiver circuit.

In some embodiments, two or more receiver circuits may be used, for example, to simultaneously process a differential clock signal and one or more single-ended data signals referenced to the clock signal. Additionally or alternatively, the two or more receiver circuits may simultaneously process differential data signals referenced to a single-ended clock signal. In certain embodiments, the rise/fall delays of each different type of signal propagating through each respective receiver circuit may be independently adjusted or controlled. For example, the rise/fall delays of various signals may be synchronized by setting the first and/or second beta ratios of each respective inverter as needed.

In other embodiments, a method may include, in response to a first enabling signal setting a first of a plurality of receiver circuits in a differential mode, receiving a differential pair of signals at a first differential amplifier and setting a first beta ratio of a first inverter coupled to the first differential amplifier to provide a rise/fall delay for the differential pair of signals through the first receiver. The method may also include, in response to a second enabling signal setting a second of a plurality of receiver circuits in a single-ended mode, receiving a single-ended signal at a second differential amplifier and setting a second beta ratio of a second inverter coupled to the second differential amplifier to provide approximately the same rise/fall delay for the single-ended signal through the second receiver.

BRIEF DESCRIPTION OF THE DRAWINGS

The following detailed description makes reference to the accompanying drawings, which are now briefly described.

Figure 1:
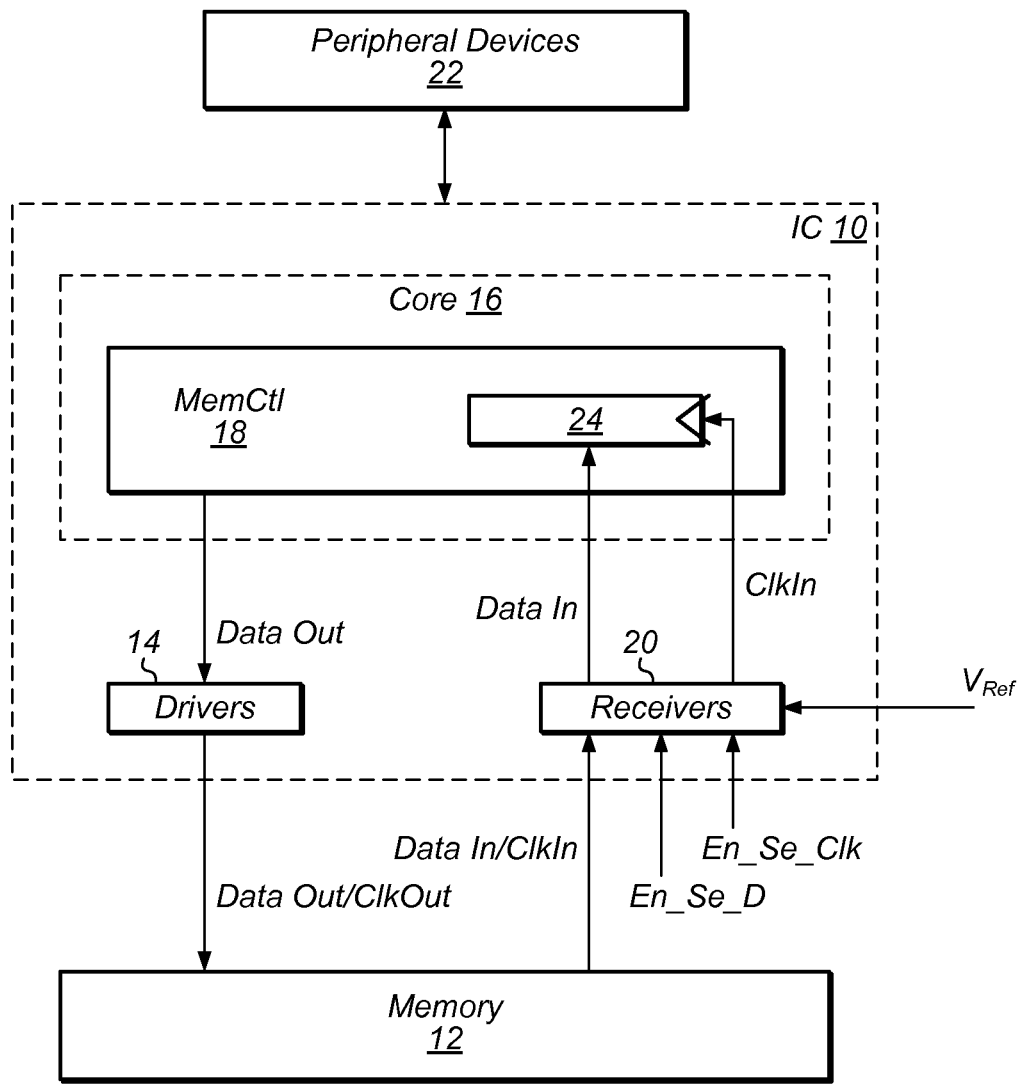
FIG. 1 is a block diagram of an integrated circuit according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, ¶6 interpretation for that unit/circuit/component.

DETAILED DESCRIPTION OF EMBODIMENTS

Overview

Turning to FIG. 1, a block diagram of integrated circuit (IC) 10 is depicted according to some embodiments. As illustrated, integrated circuit 10 is coupled to memory 12 and to peripheral devices 22.

Specifically, with respect to memory 12, integrated circuit 10 may be coupled via one or more conductors forming an output channel and one or more other conductors forming an input channel. Together, the output channel and the input channel of IC 10 may form an interface to the memory. For example, in an embodiment, memory 12 and the interface may be compliant with the mDDR2 specification. In that specification, each of the input and output channels is formed from one or more data inputs/outputs that are referenced to a clock transmitted by the source of the data. That is, data is sampled from the conductors by the receiving device using the transmitted clock. Accordingly, as shown in FIG. 1, the output channel may comprise one or more data outputs (Data Out) and at least one clock output (ClkOut). Similarly, the input channel may comprise one or more data inputs (Data In) and at least one clock input (ClkIn). In some embodiments, more than one ClkOut or ClkIn may be provided. The data outputs/inputs may be divided into groups referenced to different ones of the ClkOut outputs or ClkIn inputs. In some cases, such an arrangement may ease the skew management in the transmitter between the data and the corresponding clock.

In some embodiments, IC 10 may permit a mixture of single-ended data input(s) with differential clock input(s). In other embodiments, IC 10 may receive differential data input (s) and single ended clock input(s). Accordingly, in various implementations, a given data or clock input may include a single conductor (referenced to a voltage reference $V_{Ref}$ for determining high or low on the single conductor) or a pair of conductors on which a differential pair of signals is carried.

Generally, single-ended inputs may be inputs that are represented by a single signal that is referenced to a reference voltage ($V_{Ref}$). If the signal voltage is above $V_{Ref}$, the signal is carrying a logical one. If the signal voltage is below $V_{Ref}$, the signal is carrying a logical zero. On the other hand, differential inputs may be inputs that are represented by a differential pair of signals. These differential signals may be complementary, and thus a transition toward high on one signal is accompanied by a transition toward low on the other signal. One of the signals may be associated with the true value of the input, and the other may be associated with the complement of the input (or the inverse of the input). The input may be sensed as the difference between the true and complementary signals. In various embodiments, differential pairs may permit higher speed signaling, lower power signaling, and/or more immunity to noise on the conductors. Accordingly, a generic reference to an "input" may refer to either a single-ended or differential input. A reference to an "input signal" may refer to the single input signal of a single-ended input or one of the differential pair of signals for a differential input, for example. A similar discussion applies to the outputs described herein.

Integrated circuit 10 includes a set of driver circuits 14 configured to drive the output channel to memory 12, and a set of receiver circuits ("receivers") 20 configured to receive the input channel from memory 12. Integrated circuit 10 further includes core circuitry 16, which includes memory controller (MemCtl) 18 configured to control memory 12. Memory controller 18 is configured to transmit data out to drivers 14, which may transmit the data on the Data Out outputs, referenced to the ClkOut output. In other embodiments, memory controller 18 may also provide the output clock, and driver circuits 14 may drive the ClkOut output from the output clock. In an embodiment, the output channel may carry packets of data, which may include commands (e.g., read and write commands to the memory) as well as data (e.g., write data for a memory write command). Similarly, the input channel may carry packets of data, including read data for a memory read command. Other embodiments may have explicit address, control, and data outputs, and data inputs.

Figure 2:
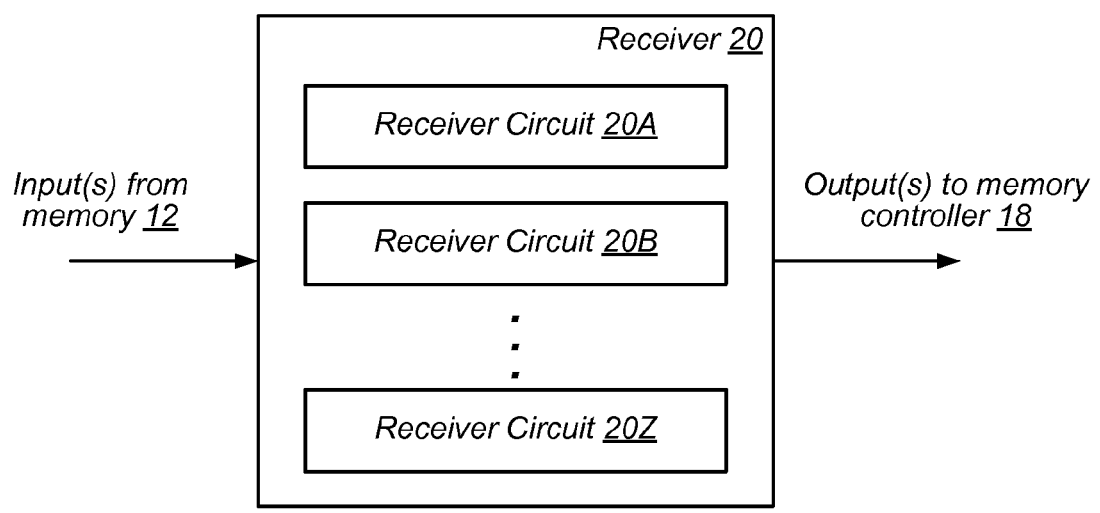
FIG. 2 is a block diagram of a receiver according to some embodiments.

As shown in FIG. 2, receiver 20 may be configured to receive inputs (e.g., Data In and ClkIn) from memory 12 and to provide those received inputs to memory controller 18. Receiver 20 may convert such inputs to internal digital signals. For single-ended inputs, the conversion may include generating a sharper transition and possibly level shifting to the voltage domain of memory controller 18. Alternatively, level shifting may be performed within memory controller 18. For differential inputs, the conversion may include recovering a digital signal from a differential pair. Each of these differential or single-ended signals may be processed by an individual one of receiver circuits 20A-Z.

As described in more detail below, receiver circuits 20A-Z within receiver 20 may receive one or more configuration signals (not shown), which indicate whether the corresponding input is single-ended or differential. For example, a configuration signal may be asserted to indicate single-ended operation and de-asserted to indicate differential operation. Other configuration signals may be defined in the opposite fashion. Further, two distinct configuration signals may be used for each respective mode of operation. Generally, a configuration signal may be considered to be asserted in either the high state or the low state, and deasserted in the other state.

In an embodiment, data inputs may be defined to be single-ended or differential as a group, and thus there may be an enable for the entire group of data signals (En_Se_D in FIG. 1), for example. In that case, those circuits within receiver 20 that are coupled to receive data inputs may receive the En_Se_D signal. On the other hand, the clock signal(s) may be separately indicated as single-ended or differential (En_Se_Clk in FIG. 1). Accordingly, those circuits within receiver 20 that receive the clock input(s) may receive the En_Se_Clk signal. In some embodiments, if there is more than one ClkIn input and corresponding data signal groups, the differential or single-ended nature of the inputs may be selected on a ClkIn and data group basis. In such embodiments, there may be multiple En_Se_D and En_Se_Clk signals coupled to respective groups of receiver circuits. The receiver circuits 20 may also receive the $V_{Ref}$ input as shown in FIG. 1 for the single-ended signals.

In some embodiments, the En_Se_D signal and the En_Se_Clk signal may be fixed (e.g., tied up or down) based on memory 12 that is included in the system with integrated circuit 10. In other embodiments, the En_Se_D signal and the En_Se_Clk signal may be programmable via software (e.g., in a register that may source the signals). Furthermore, in some cases there may be an additional enable signal (not shown) used to turn on receiver circuits 20 by setting a bias on one or more current sources such that, when enable is low, the bias goes low, and internal nodes drift up.

Receiver circuits 20 may use the En_Se_D signal and the En_Se_Clk signals to adjust a rise/fall delay through the receiver circuits, attempting to approximately match the rise/ fall delay for differential signals (e.g., enable deasserted) and single-ended signals (e.g., enable asserted). That is, receiver circuits 20 may attempt to receive and transmit single-ended inputs more rapidly, to match a more rapid reception of the differential inputs. In some embodiments, by matching the delay, timing margin reserved for skew management between data and clock signals may be reduced.

For example, referring again to FIG. 1, Data In signals are provided by receiver circuits 20 to memory controller 18, and more particularly may be input to a register 24. The received ClkIn may be the clock input to the register 24. If the delay is approximately the same for single-ended and differential inputs, the skew between the data and the clock may be limited to approximately the skew permitted on the input interface. It is noted that, on double data rate interfaces, data is transferred in response to both the rising edge and the falling edge of the clock. Register 24 may thus represent one or more registers that can be triggered on the rising edge and/or the falling edge of the clock. In general, register 24 may comprise any one or more clocked storage devices (e.g., registers, flops, latches, etc.) or the like.

Still referring to FIG. 1, memory controller 18 may include the circuitry to communicate with memory 12. Additionally, memory controller 18 may include circuitry to communicate with other components within core 16. For example, memory controller 18 may include buffers or queues to store memory requests until they can be transmitted to memory 12, arbitration and prioritization logic to select among requests to be presented to memory 12, etc.

Memory 12 may comprise any type of memory. For example, in some embodiments, the memory may be synchronous dynamic random access memory (SDRAM) that complies with the mDDR2 standard (mDDR2 SDRAM). Any other form of synchronous or asynchronous DRAM may be used. Additionally, static RAM may be used, or flash memory or any other volatile or non-volatile memory. In one implementation, one or more memory modules, each containing one or more mDDR2 DRAM chips, may be used to form memory 12.

Core circuitry 16 may generally include circuitry that implements various logical operations that integrated circuit 10 is designed to perform. For example, if the design includes one or more processors, core circuitry 16 may include circuitry that implements the processor operation (e.g., instruction fetch, decode, execution, and result write, etc.). Such processors may include general purpose processors and/or graphics processors in various embodiments. If the design includes a bridge to a peripheral interface, for example, core circuitry 16 may include the circuitry that implements the bridge operation. If the design includes other communication features such as packet interfaces, network interfaces, etc., core circuitry 16 may include circuitry implementing the corresponding features. Integrated circuit 10 may generally be designed to provide any set of operations. Generally, core circuitry 16 may comprise any combination of one or more of the following: memory arrays, combinatorial logic, state machines, flops, registers, other clocked storage devices, custom logic circuits, etc.

While a memory interface is used as an example in which a mixture of differential and single-ended inputs may be supported, other embodiments may have any interface or receiver circuit in which a mixture of differential and single-ended inputs are included. In some embodiments, receiver circuits 20 described herein may be used to provide approximately equal rise/fall delays for single-ended and differential inputs through individual receiver circuits 20A-Z of receiver 20. In other embodiments, however, receiver circuits 20A-Z may be used to purposefully introduce and/or maintain a timing difference between various types of signals. Additionally, other embodiments may implement more than one memory controller and more than one memory. For example, more than one memory may be coupled to the same memory controller, and thus there may be more than one input channel coupled to the same memory controller.

In some embodiments, the system shown in FIG. 1 may be employed in microprocessors, microcontrollers, memories, systems-on-a-chip (SoCs), application-specific integrated circuits (ASICs)—or any other type of digital or analog IC, as well as microelectromechanical systems (MEMS). Examples of electronic devices that may include one or more ICs designed using the techniques described herein include, but are not limited to, desktop computers, laptop computers, tablets, network appliances, mobile phones, personal digital assistants (PDAs), global positioning systems (GPS), e-book readers, televisions, video game consoles, electronic control units, appliances, or any other electronic devices. As such, peripherals 22 may provide additional functionality for the system, depending on the nature of the system and its intended operation. For example, peripheral devices 22 may include various communications devices, devices for audio and video playback, user interface devices (e.g., touch screen, microphone, keyboard, etc.), general I/O interfaces such as universal serial bus (USB), etc.

Illustrative Receiver Circuits

Figure 3:
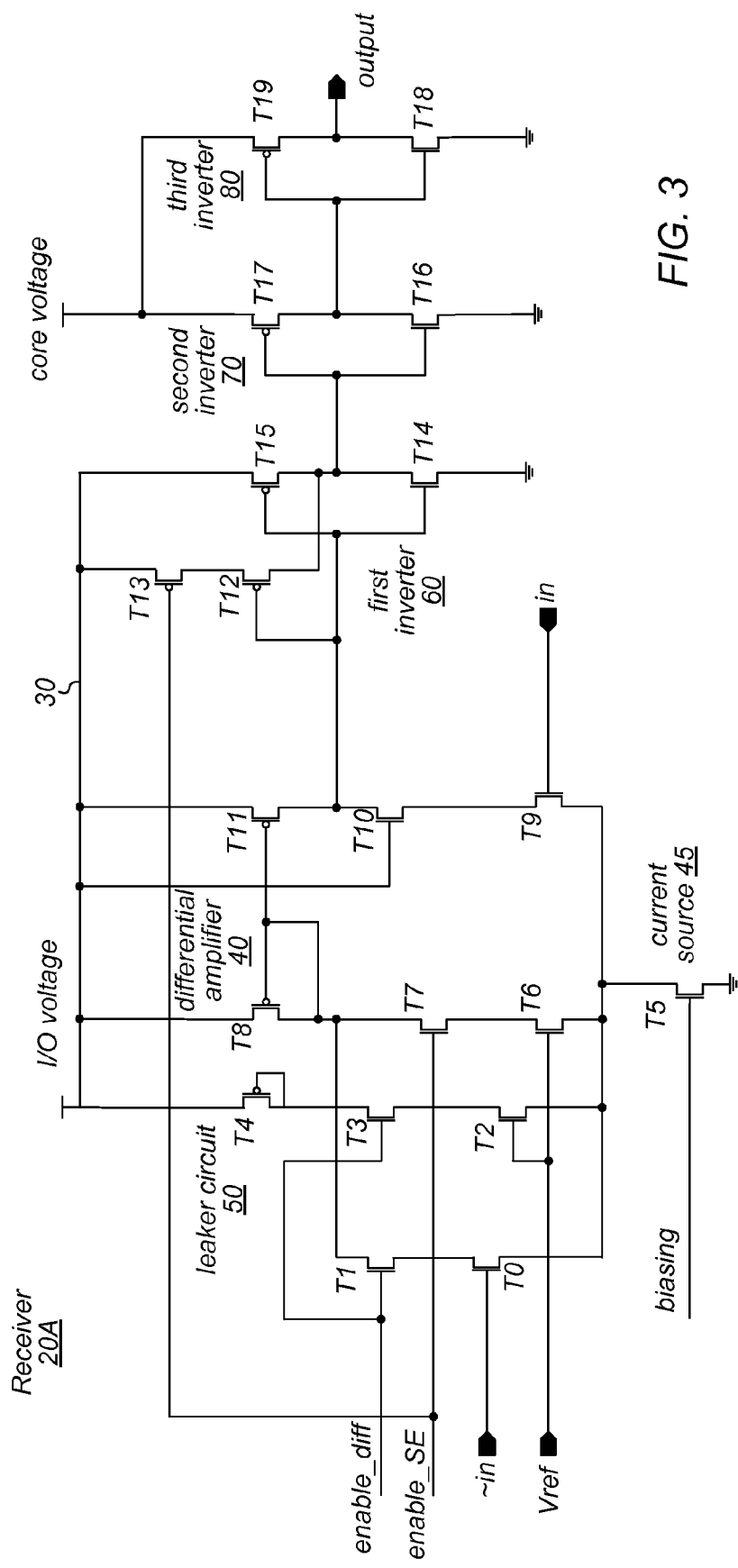
FIG. 3 is a diagram of a receiver circuit according to some embodiments.

Turning now to FIG. 3, a circuit diagram of an instance of a receiver circuit 20A-Z within receiver 20 is shown according to some embodiments. As illustrated, receiver circuit 20A may include various n-type MOS (NMOS) transistors and p-type MOS (PMOS) transistors. The standard symbols for NMOS transistors (no open circle on the gate terminal, such as the transistor T0) and PMOS transistors (open circle on the gate terminal, such as transistor T4) are used. Thus, in the embodiment as shown, T0-T3, T5-T7, T9, T10, T14, T16, and T18 are NMOS transistors and T4, T8, T11-T13, T15, T17, and T19 are PMOS transistors.

Supply conductor 30 may be powered to voltage $V_{IO}$ during use. In some embodiments, $V_{IO}$ may be the voltage used on the interface to the memory (or at least may be a voltage that is compatible with the communication on the interconnect). In other embodiments, conductor 30 may be powered to the $V_{core}$ voltage used by the core 16, and may perform a level-shifting function on the input as well. In other embodiments, the $V_{core}$ and $V_{IO}$ voltages may be equal. Supply conductor 30 is designed to carry a relatively stable voltage (as opposed to signal conductors, which carry signals that vary to covey information). While the voltage on conductor 30 may be subject to variation during use (e.g., voltage droop during high current conditions, noise, etc.), conductor 30 is otherwise nominally held at the desired voltage. For example, conductor 30 may be electrically connected to the $V_{IO}$ input pins of integrated circuit 10. Meanwhile, the output of receiver circuit 20A may swing between $V_{SS}$ (e.g., "ground" in FIG. 3) and core voltage $V_{core}$.

As illustrated, receiver circuit 20A includes differential amplifier 40. Generally, differential amplifier 40 is configured to amplify both differential signals (at inputs "in" and "~in") and single-ended signals (at "in" and "$V_{ref}$"). For example, in differential mode, an "enable_diff" signal may be applied to the gates of transistors T1 and T3 (discussed in more detail below). Meanwhile, the inputs to differential amplifier 40 may be applied to the gate of transistor T9 ("in") and to the gate of transistor T0 ("~in"). As noted above, input signals "in" and "~in" may be complementary to each other. For example, in some embodiments, "in" and "~in" may provide a differential clock or data signal. As such, the output of differential amplifier 40 may be responsive to the voltage difference between "in" and "~in;" that is, the output of differential amplifier 40 may indicate whether or not the "in" signal is greater than "~in." The sources of transistors T0 and T9 are connected to each other and to current source 45 through transistor T5, which provides a current for differential amplifier 40. A bias circuit (not shown) may provide the biasing voltage designed to bias current source 45 to provide sufficient current to provide appropriate duty cycle control for the input(s) in differential mode (i.e., approximately matching rise delay and fall delay on the output of the receiver circuit 20A).

Transistors T8 and T11 may provide a current mirroring operation, mirroring a pulldown current in transistor T0 to a pullup current on transistors T11, T10, T9 of the input stage. If the input is differential and is transmitting a binary one, the "in" signal transitions high and the "~in" signal transitions low. Transistor T9 is therefore active and is pulling down the output node between T10 and T11. The low transition of the "~in" signal decreases current in transistor T0 (and may turn off the transistor T0, if the "~in" signal swings to within a threshold voltage of $V_{SS}$). Thus, the pullup current through the transistor T11 decreases. The output of differential amplifier 40 is provided at the node between the drains of transistors T10 and T11 and may therefore transition low. Accordingly, differential amplifier 40 is inverting in this embodiment. In other embodiments, the output may be provided form the node between the transistors T1 and T8, and receiver circuit 20A may be non-inverting. Conversely, if the input is transmitting a binary zero, the "in" signal transitions low and the "~in" signal transitions high. Current through transistor T0 (and thus through transistor T11) increases, and the current through transistor T9 decreases. The output of differential amplifier 40 may thus transition high.

As previously noted, "enable_diff" signal is also applied to the gate of T3. In some embodiments, transistors T2-T3 provide leaker circuit 50. Absent leaker circuit 50, it would be possible for both inputs "in" (at the gate of T9) and "~in" (at the gate of T0) of differential amplifier 40 to cause current source 45 to drop to zero (and out of saturation), therefore potentially damaging the circuit. Accordingly, leaker circuit 50 allows some current flow or "leakage" to occur when operating in differential mode to protect one or more transistors within receiver 20A against undesirable effects. It may be noted that, during operation in single-ended mode, leg T6-T8 already provides such a current flow ("$V_{ref}$" is essentially static), and therefore leaker circuit 50 may be turned off (i.e., "enable_diff" signal is not asserted to the gate of T3).

In single-ended mode, an "enable_SE" signal may be applied to the gate of transistors T7 and T13 (discussed in more detail below). Operation of differential amplifier 40 is similar as described above for the differential signal case, but with leg T6-T8 effectively replacing leg T0, T1, and T8. As such, differential amplifier 40 receives "$V_{ref}$" at the gate of transistor T6 (instead of "~in" at the gate of T0). As illustrated in this embodiment, transistor T6 is always on to match the characteristics of select transistor T11 on the "in" leg (also discussed in more detail below).

The output node of differential amplifier 40 (i.e., the node between transistors T10 and T11) may be coupled to first inverter 60 that includes transistors T12-T15, the output of first inverter 60 (i.e., the node between the drains of transistors T14 and T15) may be coupled to second inverter 70, and the output of second inverter 70 (i.e., the node between the drains of transistors T16 and T17) may be coupled to third inverter 80. The output to memory controller 18 may be provided at the node connecting the drains of transistors T18 and T19 of third inverter 80. As shown in FIG. 3, second and third inverters 70 and 80 may provide level shifting (e.g., from $V_{IO}$ to $V_{core}$), provide a non-inverting output signal, and drive a load presented by a memory (or other external device) at the output pin or pad.

As noted above, in single-ended operation the "enable_SE" signal is also applied to the gate of transistor T13. As a result, transistor T13 is turned off, whereas in differential mode T13 is turned on (i.e., the "enable_SE" signal is not asserted). Hence, when receiver circuit 20A is operating in differential mode, a first beta ratio of first inverter 60 is given by T12 and T15 in parallel with each other and in series with T14. On the other hand, when receiver circuit 20A is operating in single-ended mode, a second beta ratio of first inverter 60 is given by T15 in series with T14 (i.e., T13 is switched off and effectively takes T12 out of first receiver 60). As illustrated in this embodiment, the first beta ratio may be higher than the second beta ratio.

Accordingly, in some embodiments the "beta ratio"—i.e., the ratio between the strength or size of the PMOS device(s) and the strength or size of the NMOS device(s)—of first inverter 60 may be selected such that, whether receiver circuit 20A is operating in differential or single-ended mode, the rise and fall delays of the input signal (or signals) through the circuit are approximately the same. In other words, by adjusting these different beta ratios, the delays of rising and falling transitions of the individual differential and single-ended signals may be matched, which in turn may yield a selected duty cycle (e.g., 50%, etc.) at the output. For example, a higher beta ratio in differential mode may be used to lower a trip point of first inverter 60, and thus the propagation of a low-to-high transition (i.e., a rise) or of a high-to-low transition (i.e., a fall) of a signal traveling through the first inverter 60 may result in a shorter rise/fall delay. Conversely, a lower beta ratio may be used to increase a trip point of first inverter 60, resulting in a longer rise/fall delay. If, for instance, a signal input is skewed toward a lower voltage range, a higher beta ratio may be selected to improve the duty cycle. Accordingly, although in some embodiments beta ratios may be used to match the total propagation delay of the differential and single-ended signals, in other embodiments such matching may be avoided by shifting the clock signal to be correctly positioned relative to the data signal in any suitable manner, and therefore matching only the rise/fall delay of the different signals.

In some cases, transistor T13 may be designed such that it has little or negligible effect in the beta ratio of first inverter 60. In other cases, T13 may be designed to purposefully change such beta ratio (e.g., in combination with T12 and/or other transistors). Although inverter 60 is depicted with transistors T12-T15, in other embodiments a different number of transistors may be used. Moreover, in the embodiment described in FIG. 3, first inverter 60 includes a first p-type transistor (T12) coupled in parallel with a second p-type transistor (T15), and an n-type transistor (T14) coupled in series with the first and second p-type transistors (T12 and T15). The first p-type transistor (T12) is switched on through transistor T13 in response to a signal enabling operation in the differential mode, thus providing the first beta ratio. The first p-type transistor (T12) is switched off through transistor T13 in the single-ended mode to provide the second beta ratio. In alternative embodiments, however, it is the "enable_diff" signal (or the inverse of "enable_SE") that may be applied to switch one or more n-type transistors (instead of T12 and/or T13; not shown) in parallel with T14, for example, therefore providing an alternativey way to control the beta ratio of first inverter 60 by changing the size of the n-type portion of the inverter. In those embodiments, first inverter 60 may include a first n-type transistor coupled in parallel with a second n-type transistor, and a p-type transistor coupled in series with the first and second n-type transistors. The first n-type transistor may be switched on in response to a signal enabling operation in the differential mode, thus providing the first beta ratio. The first n-type transistor may be switched off in differential mode to provide the first beta ratio, and it may be switched on in single-ended mode to provide the second beta ratio.

In some embodiments, enabling signals "enable_SE" and "enable_diff" may be the inverse of each other, such that at any time during its operation, receiver 20A will be either in "single-ended mode" or "differential mode," as described above with respect to "En_Se_D" shown in FIG. 1. In other embodiments, however, "enable_SE" and "enable_diff" may be independent signals which, when both are absent, may allow receiver 20A to remain idle. It is noted that other variations of receiver circuit 20 are possible. For example, current source 45 may be connected between $V_{IO}$ conductor 30 using PMOS transistors instead of NMOS transistors, etc. Furthermore, in some embodiments, the differential or single-ended selection may be hard-wired into the I/O channel to allow a single cell to be used for both types of signals and to simplify integration.

As described above, receiver circuit 20A may be viewed as having a differential mode and a single-ended mode, where the mode is selected via the one or more enabling signals (e.g., "enable_SE" and "enable_diff"). When the channel is idle, the bias to the current source may be turned off, thus saving DC power. Also, by providing one receiver circuit with two modes and selecting the mode based on the input type, a single receiver circuit may be used for all inputs and the correct mode may be selected based on whether the individual input is single-ended or differential. In some embodiments, receiver 20 includes instances 20A-Z of the same circuit shown in FIG. 3, therefore simplifying the timing characteristics of receiver 20.

Figure 4:
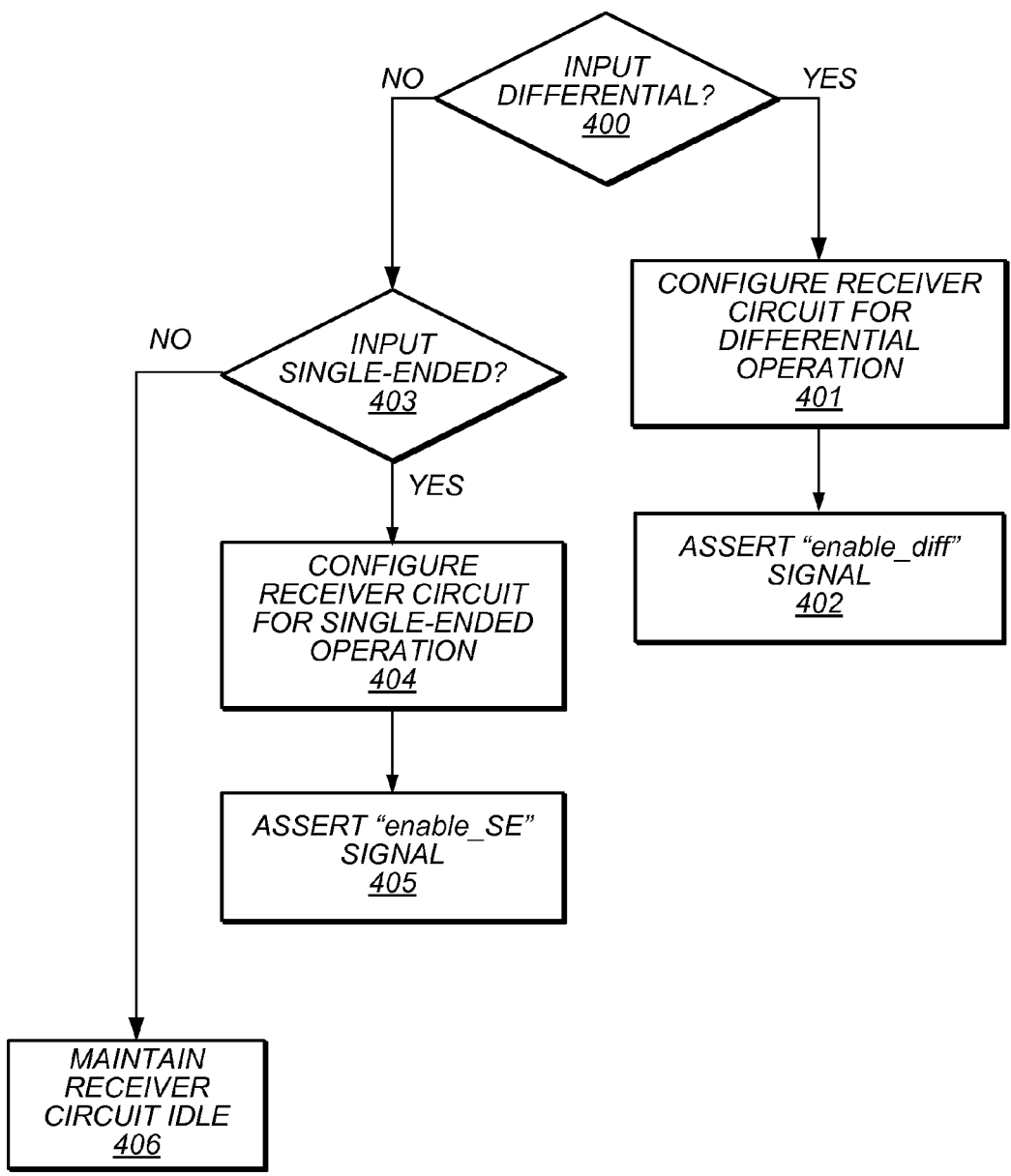
FIG. 4 is a flowchart of a method according to some embodiments.

Turning now to FIG. 4, a flowchart is shown illustrating a method according to some embodiments. While blocks 401-406 are shown in a particular order for ease of understanding, other orders may be used. In some embodiments, blocks 401-406 may be performed in parallel in combinatorial logic circuitry in the integrated circuit 10 and/or receiver 20. In other embodiments, combinations of blocks 401-406 and/or the flowchart as a whole may be pipelined over one or more clock cycles.

For each input to receiver 20, a particular receiver circuit 20A may be configured for single-ended or differential operation. At 400, the method determines whether the input to a particular receiver circuit is differential (e.g., a differential clock or data signal). If so, at 401 the method may configure that particular receiver circuit for differential operation. For example, at 402, the method may assert the "enable_diff" signal to the gates of transistors T1 and T3. Otherwise, at 403, the method determines if the input is single-ended. If so, the method may configure that particular receiver circuit for single-ended operation at 404. For example, at 405, the method may assert the "enable_SE" signal to the gate of transistors T7 and T13. Otherwise, at 406, the method may maintain the particular receiver circuit idle.

Figure 5:
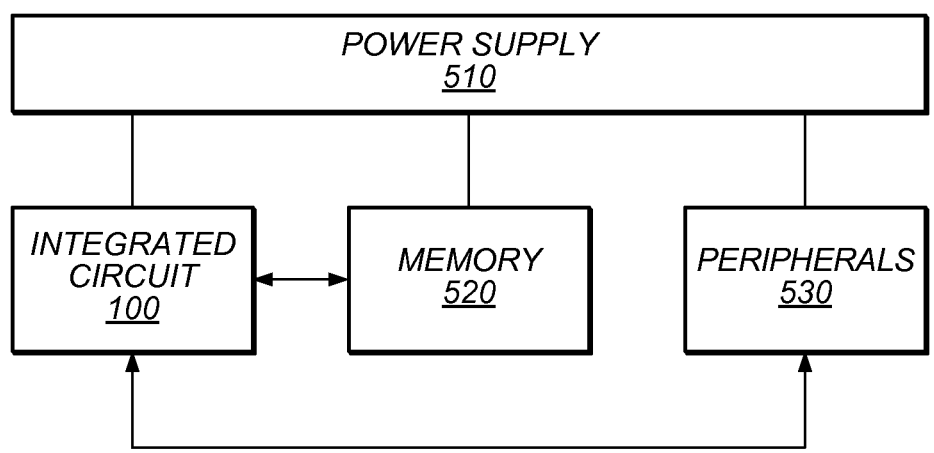
FIG. 5 is a block diagram of a system according to some embodiments.

Generally, integrated circuit 10, and more specifically the memory controller 18, may determine that input interface be idle if there is no data to be received from the memory 12. For example, the memory 12 may have a known latency for read operations, and the memory controller 18 may be able to determine when data is ready to be read based on the latency and the previously issued read commands. The input interface may be idle otherwise. Alternatively, the memory controller 18 may determine that data will be received when a read command is transmitted, and may wait until all outstanding reads are complete before determining that there is no data to be received. If the input interface is not idle, memory controller 18 may assert one or more of "enable_SE" and "enable_diff" to each appropriate receiver circuit 20A-Z. If the input interface is idle, however, memory controller 18 may de-assert these enabling signals to each receiver circuit 20A-Z An Illustrative System In some embodiments, a system may incorporate embodiments of the above described integrated circuit. Turning next to FIG. 5, a block diagram of such system is shown. As illustrated, system 500 includes at least one instance of integrated circuit 10. In some embodiments, integrated circuit 10 may be a system-on-chip (SoC) or application specific integrated circuit (ASIC) including one or more instances of core circuit 16, memory controller 18, driver circuits 14, receiver circuits 20 etc. Integrated circuit 10 is coupled to one or more peripherals 530 (e.g., peripheral devices 22) and external memory (e.g., memory 12). For example, integrated circuit 10 may include one driver for communicating signals to external memory 520 and another driver for communicating signals to peripherals 530. Power supply 510 is also provided which supplies the supply voltages to integrated circuit 10 as well as one or more supply voltages to memory 520 and/or peripherals 530. In some embodiments, more than one instance of integrated circuit 10 may be included (and more than one external memory 520 may be included as well).

Peripherals 530 may include any desired circuitry, depending on the type of system 500. For example, in an embodiment, system 500 may be a mobile device (e.g., personal digital assistant (PDA), smart phone, etc.) and peripherals 530 may include devices for various types of wireless communication, such as Wi-Fi™, Bluetooth®, cellular, global positioning system, etc. Peripherals 530 may also include additional storage, including RAM storage, solid state storage, or disk storage. Peripherals 530 may include user interface devices such as a display screen, including touch display screens or multi-touch display screens, keyboard or other input devices, microphones, speakers, etc. In other embodiments, system 500 may be any type of computing system (e.g., desktop and laptop computers, tablets, network appliances, mobile phones, personal digital assistants, e-book readers, televisions, and game consoles).

External memory 520 may include any type of memory. For example, external memory 520 may include SRAM, non-volatile RAM (NVRAM, such as "flash" memory), and/or dynamic RAM (DRAM) such as synchronous DRAM (SDRAM), double data rate (DDR, DDR2, DDR3, etc.) SDRAM, Rambus® DRAM, etc. External memory 520 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

The invention claimed is:

1. A receiver circuit comprising:
    a differential amplifier, wherein the differential amplifier is configured to receive a first signal of a differential pair of signals at a first input and a second signal of the differential pair of signals at a second input in a differential mode, and wherein the differential amplifier is configured to receive a single-ended signal at the first input and a reference signal at a third input in a single-ended mode; and an inverter coupled to the differential amplifier, wherein the inverter is configured with a first beta ratio in the differential mode and with a second beta ratio in the single-ended mode.

2. The receiver circuit of claim 1, wherein the differential amplifier is configured to switch between the differential mode and the single-ended mode in response to one or more enabling signals.

3. The receiver circuit of claim 1, wherein the differential amplifier includes a leaker circuit configured to allow current to flow through a current source coupled to the differential amplifier in the differential mode.

4. The receiver circuit of claim 1, wherein the inverter includes a first p-type transistor coupled in parallel with a second p-type transistor, and an n-type transistor coupled in series with the first and second p-type transistors, and wherein the first p-type transistor is switched on in the differential mode to provide the first beta ratio.

5. The receiver circuit of claim 1, wherein the inverter includes a first p-type transistor coupled in parallel with a second p-type transistor, and an n-type transistor coupled in series with the first and second p-type transistors, and wherein the first p-type transistor is switched off in the single-ended mode to provide the second beta ratio.

6. The receiver circuit of claim 1, wherein the inverter includes a first n-type transistor coupled in parallel with a second n-type transistor, and a p-type transistor coupled in series with the first and second n-type transistors, and wherein the first n-type transistor is switched off in the differential mode to provide the first beta ratio.

7. The receiver circuit of claim 1, wherein the inverter includes a first n-type transistor coupled in parallel with a second n-type transistor, and a p-type transistor coupled in series with the first and second n-type transistors, and wherein the first n-type transistor is switched on in the single-ended mode to provide the second beta ratio.

8. An integrated circuit comprising:
a plurality of receiver circuits, wherein each of the plurality of receiver circuits is capable of receiving a differential signal and a single-ended signal, and wherein each of the plurality of receiver circuits includes:
a differential amplifier, wherein the differential amplifier is configurable to receive a first signal of a differential pair of signals at a first input and a second signal of the differential pair of signals at a second input in a differential mode, and wherein the differential amplifier is configurable to receive a single-ended signal at the first input and a reference signal at a third input in a single-ended mode; and
an inverter coupled to the differential amplifier, wherein the inverter is configurable to provide a different trip point in the differential mode than in the single-ended mode.

9. The integrated circuit of claim 8, wherein in the differential mode the inverter includes a first p-type transistor coupled in parallel with a second p-type transistor, and an n-type transistor coupled in series with the first and second p-type transistors.

10. The integrated circuit of claim 9, wherein in the single-ended mode the inverter decouples the first p-type transistor from the second p-type transistor.

11. The integrated circuit of claim 8, wherein in the single-ended mode the inverter includes a first n-type transistor coupled in parallel with a second n-type transistor, and a p-type transistor coupled in series with the first and second n-type transistors.

12. The integrated circuit of claim 11, wherein in the differential mode the inverter decouples the first n-type transistor from the second n-type transistor.

13. A method comprising:
providing a receiver circuit including:
a differential amplifier, wherein the differential amplifier is operable to receive a first signal of a differential pair of signals at a first input and a second signal of the differential pair of signals at a second input in a differential mode, and wherein the differential amplifier is operable to receive a single-ended signal at the first input and a reference signal at a third input in a single-ended mode; and
an inverter coupled to differential amplifier; and
setting a beta ratio of the inverter to adjust a rise/fall delay of at least one of the differential pair of signals or the single-ended signal through the receiver circuit.

14. The method of claim 13, wherein setting the beta ratio in the differential mode includes switching on a first p-type transistor in parallel with a second p-type transistor in the inverter.

15. The method of claim 14, wherein setting the beta ratio in the single-ended mode decouples the first p-type transistor from the second p-type transistor.

16. The method of claim 13, wherein setting the beta ratio in the single-ended mode includes switching on a first n-type transistor in parallel with a second n-type transistor in the inverter.

17. The method of claim 16, wherein setting the beta ratio in the differential mode includes decoupling the first n-type transistor from the second n-type transistor.

18. In a circuit having a plurality of receiver circuits, wherein each of the plurality of receiver circuits is configurable to operate in a differential mode or in a single-ended mode, a method comprising:
in response to a first enabling signal, setting a first receiver of the plurality of receiver circuits in the differential mode, receiving a differential pair of signals at a first differential amplifier and setting a rise/fall delay for the differential pair of signals by controlling a trip point of a first inverter coupled to the first differential amplifier.

19. The method of claim 18, wherein the first inverter includes a first p-type transistor coupled in series with an n-type transistor, and wherein setting the rise/fall delay further comprises switching on a second p-type transistor in parallel with the first p-type transistor.

20. The method of claim 18, wherein the first inverter includes a first n-type transistor coupled in parallel with a second n-type transistor and a p-type transistor coupled in series with the first and second n-type transistors, and wherein setting the rise/fall delay further comprises switching off the first n-type transistor.

21. The method of claim 18, further comprising:
in response to a second enabling signal setting a second receiver of the plurality of receiver circuits in the single-ended mode, receiving a single-ended signal at a second differential amplifier and setting approximately the same rise/fall delay for the single-ended signal by controlling a trip point of a second inverter coupled to the second differential amplifier.

22. The method of claim 21, wherein the second inverter includes a first p-type transistor coupled in parallel with a second p-type transistor and an n-type transistor coupled in series with the first and second p-type transistors, and wherein setting approximately the same rise/fall delay includes switching off the first p-type transistor.

23. The method of claim 21, wherein the second inverter includes a first n-type transistor coupled in series with a p-type transistor, and wherein setting approximately the same rise/fall delay includes switching on a second n-type transistor in parallel with the first n-type transistor.

24. In a circuit having a plurality of receiver circuits, wherein each of the plurality of receiver circuits is configurable to operate in a differential mode or in a single-ended mode, a method comprising:
  receiving a single-ended signal at a first differential amplifier of a first one of the plurality of receiver circuits and switching off at least one transistor in a first inverter coupled to the first differential amplifier to provide a first beta ratio.

25. The method of claim 24, further comprising:
  receiving a differential pair of signals at a second differential amplifier of a second one of the plurality of receiver circuits and switching on at least one transistor in a second inverter coupled to the second differential amplifier to provide a second beta ratio, wherein the second beta ratio is higher than the second beta ratio.

* * * * *